(12) United States Patent
Harkness, IV et al.

(10) Patent No.: US 6,346,339 B1
(45) Date of Patent: *Feb. 12, 2002

(54) MAGNETIC RECORDING MEDIA WITH A NIALO$_X$ SUB-SEEDLAYER

(75) Inventors: Samuel Dacke Harkness, IV, Sunnyvale; Qixu (David) Chen; Zhong (Stella) Wu, both of Fremont; Rajiv Yadav Ranjan, San Jose, all of CA (US)

(73) Assignee: Seagate Technology LLC, Scotts Valley, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/379,505

(22) Filed: Aug. 23, 1999

Related U.S. Application Data
(60) Provisional application No. 60/102,568, filed on Sep. 30, 1998.

(51) Int. Cl.[7] .............................. G11B 5/66; G11B 5/70; C23C 14/00; C23C 14/34; B05D 5/12
(52) U.S. Cl. .............................. 428/694 TS; 204/192.1; 204/192.15; 204/192.2; 427/129; 427/131
(58) Field of Search ........................... 428/65.3, 694 T, 428/694 TS, 900; 204/192.1, 192.11, 192.12, 192.15, 192.2; 427/533, 126.2, 129, 131

(56) References Cited

U.S. PATENT DOCUMENTS

| | | | |
|---|---|---|---|
| 5,153,044 A | 10/1992 | Chen et al. | 428/64 |
| 5,631,094 A | 5/1997 | Ranjan et al. | 428/611 |
| 5,693,426 A | 12/1997 | Lee et al. | 428/611 |
| 5,800,931 A | 9/1998 | Lee et al. | 428/611 |
| 5,851,688 A | 12/1998 | Chen et al. | 428/694 T |
| 5,858,566 A | 1/1999 | Zhang | 428/694 TS |
| 6,007,924 A | * 12/1999 | Lal et al. | 428/611 |
| 6,110,582 A | * 8/2000 | Wu et al. | 428/332 |
| 6,117,570 A | * 9/2000 | Chen et al. | 428/694 T |
| 6,139,951 A | * 10/2000 | Chen et al. | 428/332 |

OTHER PUBLICATIONS

"NiAl Underlayers For CoCrTa Magnetic Thin Films" by Lee et al., IEEE Transactions on Magnetics, vol. 30, No. 6, Nov. 1994, pp. 3951–3953.

"The Role of NiAl Underlayers in Longitudinal Recording Media (Abstract)", by Ross et al., Journal of Applied Physics: Proceedings of the 41st Annual Conference on Magnetism and Magnetic Materials, vol. 81, No. 8, Apr. 15, 1997, Part 2A, p. 4369.

* cited by examiner

*Primary Examiner*—Vivian Chen
*Assistant Examiner*—Holly C. Rickman
(74) *Attorney, Agent, or Firm*—McDermott, Will & Emery

(57) ABSTRACT

Magnetic recording media exhibiting enhanced SMNR are formed with an NiAlO$_x$ sub-seedlayer for microstructural control of the underlayer to enable deposition and growth of a magnetic layer exhibiting a ($10\bar{1}0$)-predominant crystallographic orientation and small, uniform grain size. Embodiments include completely reactive sputter depositing a NiAlO$_x$ sub-seedlayer on a glass-ceramic substrate and sequentially depositing thereon a NiAl seedlayer, a Cr or Cr-alloy underlayer, e.g., CrMo, a Co—Cr magnetic layer and a protective overcoat, e.g., carbon. The resulting magnetic recording media exhibit a high SMNR, high OW, narrow PW50, improved jitter and improved Hr.

20 Claims, 3 Drawing Sheets

MAGNETIC RECORDING MEDIA WITH A NIALO$_x$ SUB-SEEDLAYER

RELATED APPLICATION

This application claims priority from Provisional Application Ser. No. 60/102,568 filed on Sep. 30, 1998 entitled: RIGID LONGITUDINAL RECORDING MEDIA WITH A REACTIVELY-SPUTTERED NiAlO$_x$ SUB-SEEDLAYER", the entire disclosure of which is hereby incorporated herein by reference.

This application contains subject matter similar to subject matter disclosed in U.S. patent application Ser. No. 09/382,581 filed on Aug. 25, 1999.

TECHNICAL FIELD

The present invention relates to magnetic recording media, such as thin film magnetic recording disks, and to a method of manufacturing the media. The present invention has particular applicability to high areal density longitudinal magnetic recording media exhibiting low media noise and enhanced magnetic performance.

BACKGROUND ART

Magnetic recording media are extensively employed in the computer industry and can be locally magnetized by a write transducer or write head to record and store information. The write transducer creates a highly concentrated magnetic field which alternates direction based upon bits of the information being stored. When the local magnetic field produced by the write transducer is greater than the coercivity of the recording medium, grains of the recording medium at that location are magnetized. The grains retain their magnetization after the magnetic field produced by the write transducer is removed. The direction of the magnetization matches the direction of the applied magnetic field. the magnetization of the recording medium can subsequently produce an electrical response to a write transducer, allowing the stored information to be read.

There is an ever increasing demand for magnetic recording media with higher storage capacity, lower noise and lower costs. Efforts, therefore, have been made to reduce the size required to magnetically record bits of information, while maintaining the integrity of the information as size is decreased. The space necessary to record information in magnetic recording media depends upon the size of transitions between oppositely magnetized areas. It is, therefore, desirable to produce magnetic recording media that will support the smallest transition size possible. However, the output from small transition sizes must avoid excessive noise to reliably maintain the integrity of the stored information. Media noise is generally characterized as the sharpness of a signal on readback against the sharpness of a signal on writing and is generally expressed in signal-to-noise ratio (SMNR).

The increasing demands for higher areal recording density impose increasingly greater demands on thin film magnetic recording media in terms of remanent coercivity (Hr), magnetic remanance (Mr), coercivity squareness (S*), medium noise, i.e., SMNR, and narrow track recording performance. It is extremely difficult to produce a magnetic recording medium satisfying such demanding requirements.

The linear recording density can be increased by increasing the Hr of the magnetic recording medium. This objective must be accompanied with a decrease in the medium noise, as by maintaining very fine magnetically non-coupled grains. Medium noise in thin films is a dominant factor restricting increased recording density of high density magnetic hard disk drives, and is attributed primarily to inhomogeneous grain size and intergranular exchange coupling. Accordingly, in order to increase linear density, medium noise must be minimized by suitable microstructure control.

Longitudinal magnetic recording media containing cobalt (Co) or a Co-based alloy magnetic films with a chromium (Cr) or Cr alloy underlayer deposited on a nonmagnetic substrate have become the industry standard. For thin film longitudinal magnetic recording media, the desired crystallized structure of the Co and Co alloys is hexagonal close packed (hcp) with uniaxial crystalline anisotropy and a magnetization easy direction along the c-axis is in the plane of the film. The better the in-plane c-axis crystallographic texture, the more suitable is the Co alloy thin film for use in longitudinal recording to achieve high remanance. For very small grain sizes coercivity increases with increased grain size. The large grains, however, result in greater noise. Accordingly, there is a need to achieve high coercivities without the increase in noise associated with large grains. In order to achieve low noise magnetic recording media, the Co alloy thin film should have uniform small grains with grain boundaries capable of magnetically isolating neighboring grains. This type of microstructural and crystallographic control is typically attempted by manipulating the deposition process, and proper use of underlayers and seedlayers.

Underlayers can strongly influence the crystallographic orientation, the grain size and chemical segregation of the Co alloy grain boundaries. Conventional underlayers include Cr and alloys of Cr with elements such as titanium (Ti), tungsten (W), molybdenum (Mo) and vanadium (V).

There are other basic characteristics of magnetic recording media, aside from SMNR, which are indicative of recording performance, such as half-amplitude pulse width (PW50), overwrite (OW) , and modulation level. A wide PW50 indicates that adjacent bits are crowded together resulting in interference which limits the linear packing density of bits in a given track and, hence, reduces packing density in a given area thereby eliminating the recording capacity of the magnetic recording medium. Accordingly, a narrow PW50 is desirable for high areal recording density.

OW is a measure of the ability of the magnetic recording medium to accommodate overwriting of existing data. In other words, OW is a measure of what remains of a first signal after a second signal, e.g., at a different frequency, has been written over it on the medium. OW is considered low or poor when a significant amount of the first signal remains.

It is extremely difficult to obtain optimum performance from a magnetic recording medium by optimizing each of the PW50, OW, SMNR and modulation level, as these performance criteria are interrelated and tend to be offsetting. For example, if coercivity is increased to obtain a narrower PW50, OW is typically adversely impacted, as increasing coercivity typically degrades OW. A thinner medium having a lower Mr x thickness (Mrt) yields a narrower PW50 and better OW; however, SMNR decreases since the medium signal is typically reduced if the electronic noise of the system is high. Increasing the squareness of the hysteresis loop contributes to a narrower PW50 and better OW; however, noise may increase due to intergranular exchange coupling and magnetostatic interaction. Thus, a formidable challenge is present in optimizing magnetic performance in terms of PW50, OR, SMNR and modulation level.

It is recognized that the magnetic properties, such as Hr, Mr, S* and SMNR, which are critical to the performance of a magnetic alloy film, depend primarily upon the microstructure of the magnetic layer which, in turn, is influenced by the underlying layers, such as the underlayer. It is also recognized that underlayers having a fine grain structure are highly desirable, particular for growing fine grains of hcp Co alloys deposited thereon.

It has been reported that nickel-aluminum (NiAl) films exhibit a grain size which is smaller than similarly deposited Cr films, which are the underlayer of choice in conventional magnetic recording media. Li-Lien Lee et al., "NiAl Underlayers For CoCrTa Magnetic Thin Films", IEEE Transactions on Magnetics, Vol. 30, No. 6, pp. 3951–3953, 1994. Accordingly, NiAl thin films are potential candidates as underlayers for magnetic recording media for high density longitudinal magnetic recording. However, it was found that the coercivity of a magnetic recording medium comprising an NiAl underlayer is too low for high density recording, e.g. about 2,000 oersteds (Oe). The use of an NiAl underlayer is also disclosed by C. A. Ross et al., "The Role Of An NiAl Underlayers In Longitudinal Thin Film Media", J. Appl. Phys. 81(8), P.4369, 1997. NiAl underlayers are also disclosed by Lee et al. in U.S. Pat. No. 5,693,426 and Lee et al. in U.S. Pat. No. 5,800,931. A magnetic recording medium comprising a NiAl seedlayer under a Cr underlayer is disclosed by Zhang in U.S. Pat. No. 5,858,566.

In copending U.S. patent application Ser. No. 09/152,326 filed on Sep. 14, 1998 now U.S. Pat. No. 6,117,570 issued Sep. 12, 2000 a magnetic recording medium is disclosed comprising a NiAl seedlayer having an oxidized surface, a chromium underlayer on the seedlayer, and a magnetic layer on the underlayer. Chen et al. in U.S. Pat. No. 5,153,044 disclose magnetic recording medium comprising a non-magnetic substrate, a plated nickel-phosphorous layer thereon, and a sputtered underlayer comprising a nickel phosphorous layer formed on the plated nickel phosphorous layer. It is further disclosed that the sputtering target can comprise aluminum. Ranjan et al. in U.S. Pat. No. 5,631,094 disclose a magnetic recording medium comprising a plated nickel phosphorous layer on a substrate and an amorphous sputtered nucleation layer of nickel phosphorous deposited on the plated nickel phosphorous layer. The sputtered nucleation layer can comprise alumina. Chen et al. in U.S. Pat. No. 5,851,688 disclose a magnetic recording medium comprising a nickel phosphorous underlayer and a nickel phosphorous nucleation layer sputtered thereon. The nucleation layer can comprise an oxide dopant, such as alumina.

There exists a need for high areal density longitudinal magnetic recording media exhibiting high Hr and high SMNR. There also exists a need for magnetic recording media containing a glass or glass ceramic substrate exhibiting high Hr, high SMNR, high OW, a narrow PW50 and improved jitter.

DISCLOSURE OF THE INVENTION

An advantage of the present invention is a magnetic recording medium for high areal recording density exhibiting low noise and high Hr.

Another advantage of the present invention is a method of manufacturing a magnetic recording medium suitable for high areal recording density and exhibiting low noise and high Hr.

Additional advantages and features of the present invention will be set forth in part in the description which follows and in part will become apparent to those having ordinary skill in the art upon examination of the following only to be learned from the practice of the present invention. The advantages of the present invention may be realized and obtained and particularly pointed out in the appended claims.

According to the present invention, the foregoing and other advantages are achieved by a magnetic recording medium comprising: a non-magnetic substrate; a nickel-aluminum-oxygen sub-seedlayer on the substrate; a nickel aluminum (NiAl) seedlayer on the sub-seedlayer; an underlayer on the seedlayer; and a magnetic layer on the underlayer.

Another aspect of the present invention is a method of manufacturing a magnetic recording medium, the method comprising: depositing a nickel-aluminum-oxygen sub-seedlayer on a non-magnetic substrate; depositing a nickel aluminum (NiAl) seedlayer on the sub-seedlayer; depositing an underlayer on the seedlayer; and depositing a magnetic layer on the underlayer.

Embodiments of the present invention comprise depositing a fully reactively sputtered nickel-aluminum-oxygen (NiAlO$_x$) layer functioning as a sub-seedlayer on a nonmagnetic substrate under the NiAl seedlayer to obtain a significant enhancement in SMNR. Embodiments of the present invention further comprise depositing a CrMo underlayer on the NiAl seedlayer and depositing a cobalt-chromium-platinum-tantalum-niobium (CoCrPtTaNb) magnetic layer on the underlayer. The NiAlO$_x$ layer can be formed by reactive sputtering employing argon and oxygen by DC magnetron sputtering. The use of a NiAlO$_x$ sub-seedlayer stabilizes the (112) sheet texture in the Cr or Cr-alloy underlayer, thereby enabling the deposition and growth of a hcp cobalt alloy layer having a (10$\bar{1}$0) -predominant crystallographic orientation. Further embodiments of the present invention comprise a glass or glass ceramic substrate wherein the NiAlO$_x$ sub-seedlayer homogenizes the nucleation surface via amorphization arising from the low temperature oxidation process.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its details are capable of modifications in various obvious respects, all without departing from the present invention. Accordingly, the drawings and description are to be regarded as illustrative in nature and not as restrictive.

DESCRIPTION OF THE INVENTION

Figure 1:
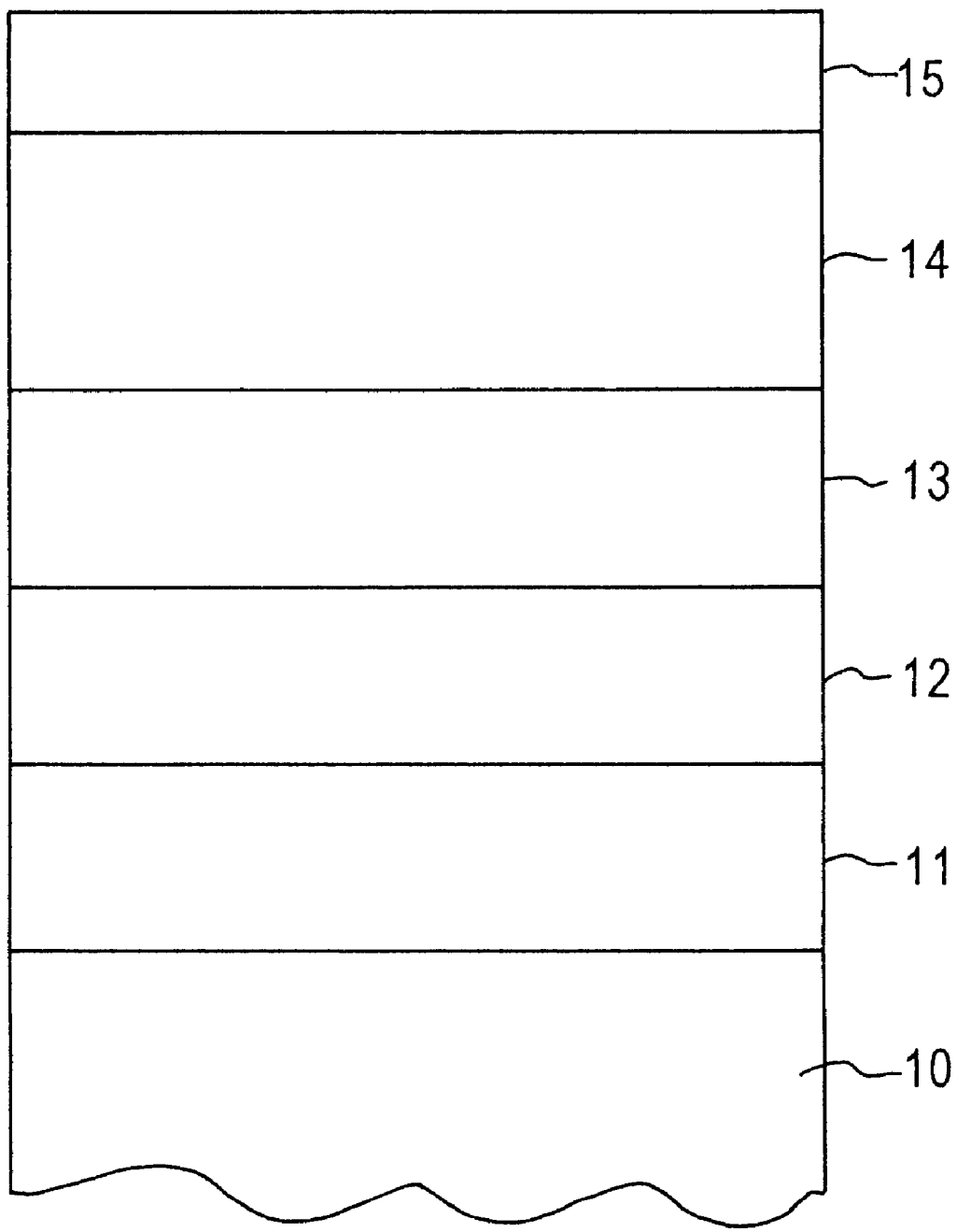
FIG. 1 schematically depicts a magnetic recording medium in accordance with an embodiment of the present invention.

The present invention provides magnetic recording media suitable for high areal longitudinal recording density exhibiting high Hr, high SMNR, high OW, narrow PW50 and improved jitter. The present invention achieves these technological advantages by strategically reducing the size of the grains of the underlayer and magnetic layer while increasing the uniformity of the grains of the underlayer and magnetic layer. It was found that the incorporation of a fully reactively-sputtered $NiAlO_x$ layer beneath the NiAl seedlayer significantly enhanced SMNR and homogenized the nucleation surface of a glass or glass ceramic substrate through amorphization during low temperature oxidation, thereby enabling the NiAl seedlayer to nucleate according to its inherent growth texture, i.e., a (112) texture.

The exact mechanism by which the formation of a $NiAlO_x$ layer between the substrate and the NiAl seedlayer achieves a significant improvement in SMNR as well as improved magnetic performance is not known with certainty. However, it is believed that the $NiAlO_x$ sub-seedlayer enables the NiAl seedlayer to nucleate according to its inherent growth (112) texture thereby stabilizing the (112) sheet texture in the underlayer. The stabilization of the (112) sheet texture in the underlayer enables increased ($10\bar{1}0$) texture in the hcp cobalt alloy magnetic layer. Thus, the present invention enjoys particular applicable with glass or glass ceramic substrates.

Conventional practices to achieve high areal recording densities of 10 $Gb/in^2$ and greater involve manipulating the crystallographic orientation of the Co-alloy magnetic layer. Higher Hr and a higher SMNR characteristics can be achieved when the magnetocrystalline anisotropy is optimized with the c-axis in the plane of the film. It is generally accepted that the sheet texture corresponding to the hexagonal (10.0) cobalt planes facilitates the greatest improvement in SMNR. The most practical solution is to process the sub-layer structure such that the lattice parameter of the interfacing surface with the cobalt layer is closest to that of the (11.0) and (00.2) cobalt planes arranged orthogonally, to avoid alternative textures in the magnetic layer emanating from surface energy considerations. The present invention achieves that objective by strategically providing a fully reactively-sputtered $NiAlO_x$ layer under an NiAl seedlayer on which a Cr-containing underlayer is formed.

Embodiments of the present invention comprise fully reactively sputtering an $NiAlO_x$ layer on any of various substrates conventionally employed in the manufacture of magnetic recording media, such as glass-ceramic or glass substrates. The $NiAlO_x$ sub-seedlayer, NiAl seedlayer and underlayer are deposited at an appropriate thickness which can be readily determined in a particular situation given the guidance of the present disclosure and disclosed objectives. For example: the $NiAlO_x$ sub-seedlayer can be deposited at a thickness of about 200 Å to about 1,000 Å, e.g., about 300 Å to about 600 Å; the NiAl seedlayer can be deposited at a thickness of about 100 Å to about 1000 Å, e.g., about 200 Å to about 400 Å; and the Cr-containing underlayer can be deposited at a thickness of about 20 Å to about 1000 Å, e.g., about 25 Å to about 100 Å. Embodiments of the present invention include depositing an underlayer containing about 50 to about 100 at. % Cr, i.e., a Cr or Cr alloy underlayer, such as Cr—Mo, Cr—Mn, Cr—V or Cr—W.

The use of a $NiAlO_x$ sub-seedlayer in accordance with embodiments of the present invention has been found to improve the recording performance of a wide range of Co-magnetic alloys, particular Co-Cr magnetic alloys. Thus, suitable magnetic layers for use in embodiments of the present invention include cobalt-chromium-platinum (CoCrPt), cobalt-chromium-tantalum (CoCrTa), cobalt-chromium-platinum-tantalum (CoCrPtTa) CoCrPtTaNb magnetic alloys.

Embodiments of the present invention further comprise depositing a conventional carbon-containing protective overcoat on a magnetic layer, as by sputtering, and depositing a conventional lubricant topcoat on the carbon-containing protective overcoat. Multi-layer structures formed in accordance with embodiments of the present invention can be implemented in a standard serial static sputter system which is generally configured with sequential deposition stations under vacuum until completion. Deposition of the NiAl seedlayer, a CrMo underlayer, and a CoCrPtTaNb magnetic layer can be deposited by standard DC-magnatron processing, while the carbon protective overcoat can be applied either by sputtering or other conventional deposition techniques.

The formation of the $NiAlO_x$ layer in accordance with embodiments of the present invention is implemented by reactive sputtering, as by employing a mixture of two gasses, such as a mixture of argon and oxygen, e.g., about 20 vol. % oxygen. The gasses can be introduced into one of the NiAl DC magnatron sputtering chambers at a total pressure of about 5 mTorr. The active gas mix supplies $Ar^+$ ions necessary for sputtering as well as reactive oxygen ions, e.g., $O_3$ and O, that combine with nucleating Ni and Al species to form the $NiAlO_x$ sub-seedlayer of the present invention. Advantageously, the degree of oxygenation in the deposited $NiAl_x$ sub-seedlayer, i.e., "x", can be controlled by selecting the appropriate amounts of reactive gasses. Thus, embodiments of the present invention comprise magnetic recording media having a reactively sputter deposited $NiAlO_x$ sub-seedlayer wherein "x" ranges from greater than about 0.01 to less than about 0.9. In another embodiment of the present invention, the $NiAlO_x$ sub-seedlayer is deposited using a NiAl target containing about 0.001 to about 0.9 at. % of oxygen. These targets can be manufactured using convention powder processing techniques, e.g., hot isostatic pressing (HIP) or hot pressing (HP). In this way, the sub-seedlayer microstructure can be tailored to present and future requirements of subsequent layers, particularly in achieving a suitably uniform grain size in the subsequently deposited underlayer and magnetic layer of no greater than 13 nm, e.g., about 9 to about 13 nm, as well as ensuring a (112) crystallographic orientation in the underlayer.

An embodiment of the present invention is schematically illustrated in FIG. 1 and comprises substrate 10, e.g., a glass or glass-ceramic substrate. The $NiAlO_x$ sub-seedlayer 11 is then reactively sputter deposited on substrate 10, and an NiAl seedlayer 11 is deposited on the $NiAlO_x$ sub-seedlayer. NiAl underlayer can comprise about 45 to about 55 at. % of each of Ni and Al. A CrMo underlayer 13 is then deposited on the NiAl seedlayer 12, and a CoCrPtTaNb magnetic layer 14 deposited on CrMo underlayer 13. A carbon-containing protective overcoat 15 is then deposited on magnetic layer 14. As in conventional practices, a lubricant topcoat (not shown) is deposited on the protective overcoat 15. It should be recognized that layers 11, 12, 13, 14, 15 as well as the lubricant topcoat are sequentially deposited on both sides of non-magnetic substrate 10.

Figure 2:
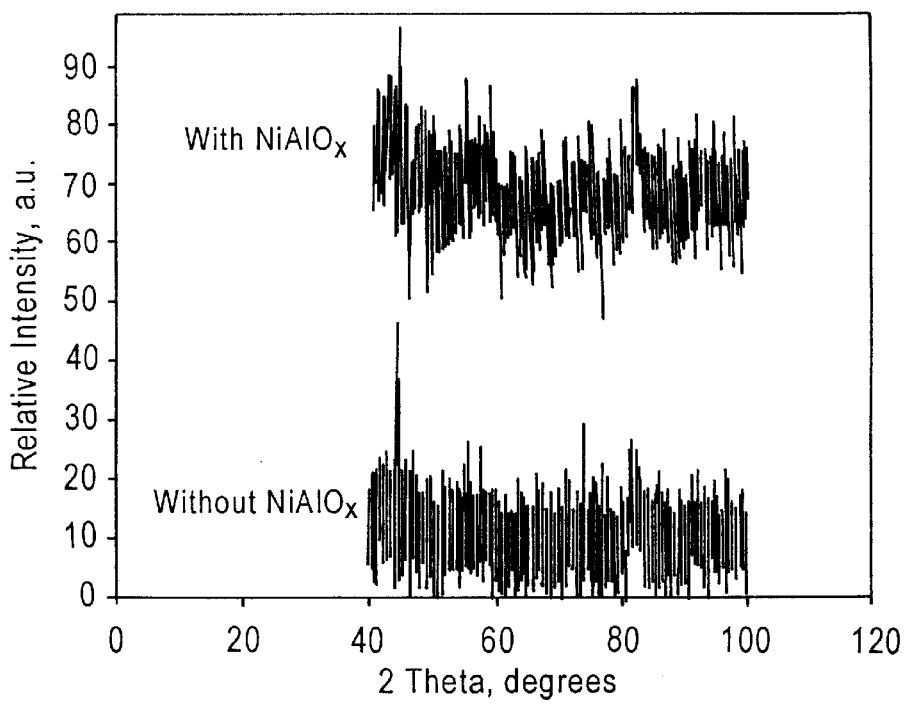
FIG. 2 shows comparative x-ray diffraction (XRD) spectra for multi-layer structures with and without the inventive NiAlO$_x$ sub-seedlayer.

FIG. 2 shows comparative XRD spectra for multi-layer structures with and without the inventive $NiAl_x$ sub-seedlayer. The films were fabricated to reveal only the sub-layer texture and, hence, the Co alloy magnetic layer was omitted in order to simplify the analysis of the microstructure in determining the stabilization of the (112) sheet texture in the Cr-alloy underlayer. An inspection of the relative intensity ratios shown in FIG. 2 between the (112) and (110) peaks reveals an increased (112) crystallographic texture for the structures containing the $NiAlO_x$ sub-seedlayer. With improved (112) sheet texture in the underlayer, it is possible to achieve (10$\bar{1}$0) texture in the hcp Cr-magnetic layer. This advantageous result is clearly demonstrated in the change in SMNR between the media fabricated with and without the NiAlO$_x$ sub-seedlayer as shown in FIG. 3.

Figure 3:
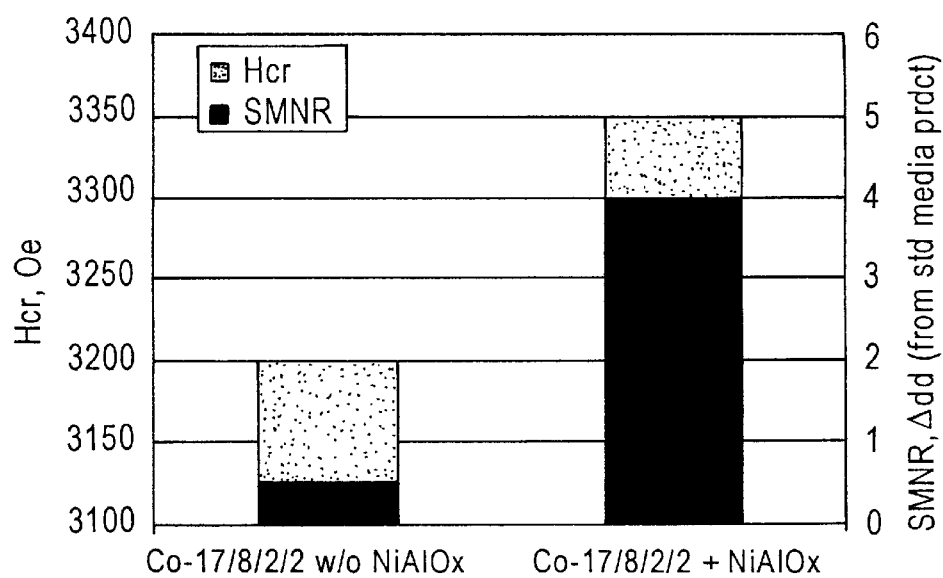
FIG. 3 contains plots comparing the magnetic performance and SMNR for multi-layer structures with and without the inventive NiAlO$_x$ sub-seedlayer.

FIG. 3 contains comparative plots for the magnetic performance of structures formed with and without the inventive NiAlO$_x$ sub-seedlayer. Structures formed with the inventive NiAlO$_x$ sub-seedlayer exhibited a significant and unexpected improvement in SMNR to about 2 dB greater than structures formed without the inventive NiAlO$_x$ sub-seedlayer, and about 4 dB greater than a conventional CrX/CoCrXY media systems. In addition, commensurate improvements were found in OW performance, PW50, jitter and Hr. It is believed that most if not all of the advantages achieved by the present invention stems from the formation of a cobalt sheet structure having a (10$\bar{1}$0)-predominant crystalline structure with a small uniform grain size distribution, such as less than about 13 nm, e.g., about 9 to about 13 nm.

Figure 4:
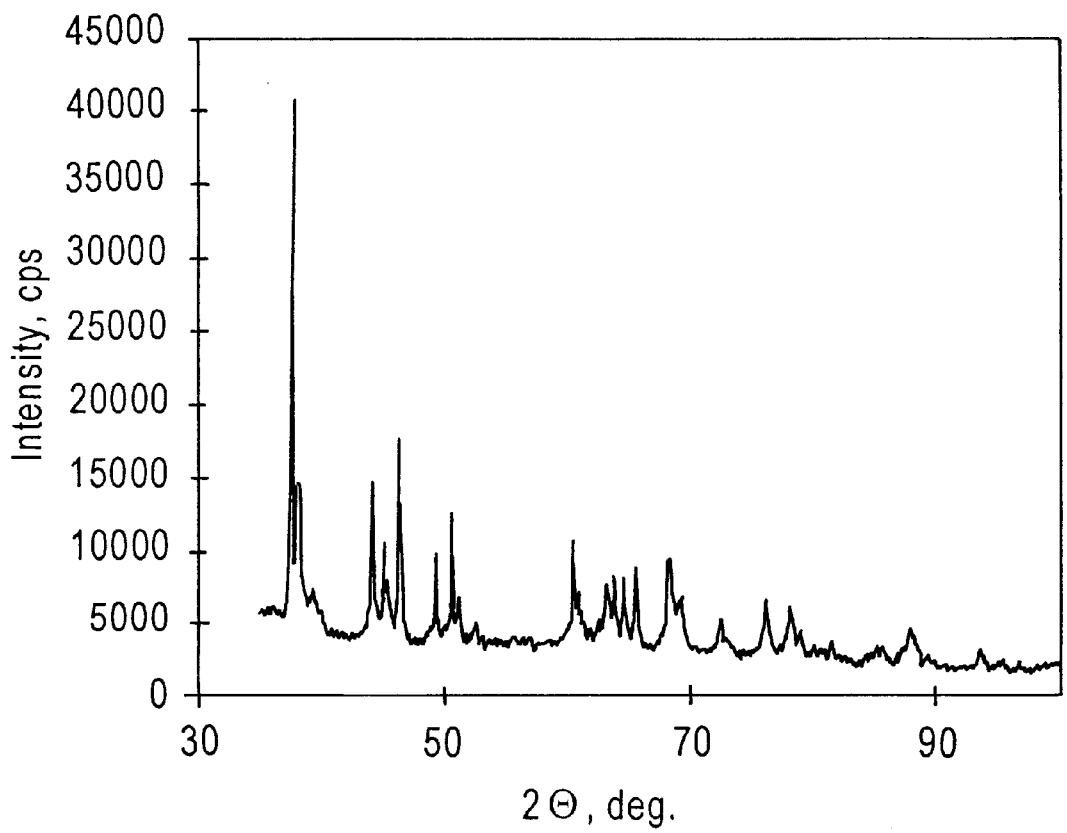
FIG. 4 is a standard XRD spectrum for a bare glassceramic substrate.

The use of the inventive NiAlO$_x$ sub-seedlayer is particularly effective in media fabricated on glassceramic substrates. FIG. 4 shows a standard XRD spectrum for a bare glass-ceramic substrate. Multiplicity in crystallographic orientation and allotropic phase are readily apparent. As its name applies, a glass-ceramic substrate contains both crystalline and amorphous localized regions on the disk surface. While this may solve many mechanical stability problems for rigid media applications, a differential environment is created for arriving sub-layer species hoping to nucleate into the preferred (112) texture. The use of the inventive NiAlO$_x$ sub-seedlayer advantageously homogenizes the nucleation surface through amorphization arising from low-temperature oxidation, e.g., a temperature of about 25° C. to about 200° C. In this way, the NiAl seedlayer will nucleate according to its inherent growth texture which has been repeatedly demonstrated to be (112).

The present invention advantageously enables microstructural control for a sub-layer configuration fabricated on rigid substrates by incorporating a fully reactively-sputtered NiAlO$_x$ sub-seedlayer. The present invention advantageously provides high areal recording density longitudinal magnetic recording media exhibiting high SMNR, narrow PW50, high OW, and high Hr. The present invention enjoys particular applicability in longitudinal magnetic recording media configurations employing a glass-ceramic or glass substrate. Sheet textures of (112) orientation in the sub-layer structure is utilized to obtain the advantageous (10$\bar{1}$0) Co layer structure and commensurate improvement in recording media performance. The present invention is applicable to the production of various types of magnetic recording media, and is not limited to any particular substrate material, underlayer, magnetic layer, protective overcoat or lubricant topcoat.

Only certain embodiments of the present invention and but a few examples of its versatility are shown and described in the present disclosure. It is to be understood that the present invention is capable of use in various other combinations and in environments, and is capable of changes and modifications within the scope of the inventive concept as expressed herein.

What is claimed is:

1. A magnetic recording medium comprising:
   a non-magnetic substrate;
   a nickel-aluminum-oxygen sub-seedlayer on the substrate;
   a nickel aluminum (NiAl) seedlayer on the sub-seedlayer;
   an underlayer on the seedlayer; and
   a magnetic layer on the underlayer.

2. A magnetic recording medium according to claim 1, wherein the sub-seedlayer is represented by the formula NiAlO$_x$ and "x" is about 0.001 to about 0.9.

3. The magnetic recording medium according to claim 1, wherein the underlayer comprises chromium or a chromium alloy.

4. The magnetic recording medium according to claim 3, wherein the underlayer comprises a chromium-molybdenum alloy and the magnetic layer comprises an alloy containing cobalt and chromium.

5. The magnetic recording medium according to claim 3, wherein the substrate comprises a glass or glass-ceramic material.

6. The magnetic recording medium according to claim 3, wherein the sub-seedlayer has a thickness of about 50 Å to about 1,000 Å.

7. The magnetic recording medium according to claim 3, wherein the seedlayer has a thickness of about 100 Å to about 1,000 Å.

8. The magnetic recording medium according to claim 1, wherein:
   the underlayer comprises a chromium or chromium alloy and exhibits a (112)-dominant crystallographic orientation; and
   the magnetic layer comprises an alloy containing cobalt and chromium, exhibits a (10$\bar{1}$0)-dominant crystallographic orientation, and has a grain size no greater than about 13 nm.

9. A method of manufacturing a magnetic recording medium, the method comprising:
   depositing a nickel-aluminum-oxygen sub-seedlayer on a non-magnetic substrate;
   depositing a nickel aluminum (NiAl) seedlayer on the sub-seedlayer;
   depositing an underlayer on the seedlayer; and
   depositing a magnetic layer on the underlayer.

10. The method according to claim 9, comprising depositing the sub-seedlayer by reactive sputtering.

11. The method according to claim 10, comprising depositing the sub-seedlayer by reactive sputtering in an atmosphere containing argon and oxygen.

12. The method according to claim 10, comprising depositing the sub-seedlayer using a NiAl target containing about 0.001 at. % to about 0.9 at. % of oxygen.

13. The method according to claim 10, wherein the sub-seedlayer is represented by the formula NiAlO$_x$, and "x" is about 0.001 to about 0.9.

14. The method according to claim 10, comprising depositing chromium or a chromium alloy as the underlayer.

15. The method according to claim 14, comprising depositing an alloy of chromium and molybdenum as the underlayer and an alloy containing cobalt and chromium as the magnetic layer.

16. The method according to claim 15, comprising depositing the sub-seedlayer on a glass or glass-ceramic substrate.

17. The method according to claim 10, comprising depositing the sub-seedlayer at a thickness of about 50 Å to about 1,000 Å.

18. The method according to claim 10, comprising depositing the seedlayer at a thickness of about 100 Å to about 1,000 Å.

19. The method according to claim 10, comprising:
   depositing chromium or a chromium alloy as the underlayer having a (112)-dominant crystallographic orientation; and depositing an alloy containing cobalt and chromium as the magnetic layer having a (10$\bar{1}$0)-dominant crystallographic orientation and a grain size no greater than about 13 nm.

20. The magnetic recording medium according to claim 1, wherein sub-seedlayer is fully reactively-sputtered.

* * * * *